United States Patent
Ito et al.

(10) Patent No.: US 11,885,864 B2
(45) Date of Patent: Jan. 30, 2024

(54) MAGNETIC RESONANCE IMAGING APPARATUS AND METHOD OF CONTROLLING THE SAME

(71) Applicant: FUJIFILM Healthcare Corporation, Chiba (JP)

(72) Inventors: Kosuke Ito, Chiba (JP); Atsushi Kuratani, Chiba (JP)

(73) Assignee: FUJIFILM Healthcare Corporation, Chiba (JP)

( * ) Notice: Subject to any disclaimer, the term of this patent is extended or adjusted under 35 U.S.C. 154(b) by 142 days.

(21) Appl. No.: 17/457,052

(22) Filed: Dec. 1, 2021

(65) Prior Publication Data
US 2022/0187403 A1    Jun. 16, 2022

(30) Foreign Application Priority Data
Dec. 14, 2020    (JP) .................... 2020-206904

(51) Int. Cl.
*G01R 33/561* (2006.01)
*G01R 33/565* (2006.01)
*G01R 33/54* (2006.01)

(52) U.S. Cl.
CPC ....... *G01R 33/5617* (2013.01); *G01R 33/543* (2013.01); *G01R 33/5611* (2013.01); *G01R 33/56545* (2013.01)

(58) Field of Classification Search
CPC .............. G01R 33/5617; G01R 33/543; G01R 33/5611; G01R 33/56545; G01R 33/565; G01R 33/5615; A61B 5/055; A61B 5/7203; A61B 5/7257
See application file for complete search history.

(56) References Cited

U.S. PATENT DOCUMENTS

| 5,334,936 | A  | * | 8/1994  | Machida  | G01R 33/565 |
|           |    |   |         |          | 324/309     |
| 2016/0139222 | A1 | * | 5/2016 | Frydman  | G01R 33/4833 |
|           |    |   |         |          | 324/309     |
| 2020/0319283 | A1 | * | 10/2020 | Wang    | G01R 33/5608 |

OTHER PUBLICATIONS

Ito, Kosuke, and Atsushi Kuratani. "Dispersing FID artifact uniformly by modulating phase of 180 degrees pulse of Spin Echo sequence with quadratic function." (Year: 2021).*
Michael N. Hoff et al. "Artifacts in Magnetic Resonance Imaging", Chapter 9, pp. 165-190, Image Principles, Neck, and the Brain, Research Gate (2016).

* cited by examiner

*Primary Examiner* — Rishi R Patel
(74) *Attorney, Agent, or Firm* — Paul Teng

(57) ABSTRACT

Generation of artifacts caused by the FID signal is suppressed even when the parallel imaging is applied to the imaging using a spin echo type pulse sequence. In performing a pulse sequence of a spin echo type using an excitation RF pulse for exciting nuclear spin and an inversion RF pulse for inverting excited nuclear spin as a high-frequency magnetic field pulse, a high-frequency transmitter of a MRI apparatus changes the phase of the inversion RF pulse according to the phase encoding and the phase encoding number imparted for each echo signal. Specifically, the phase of the inversion RF pulse is controlled to be a quadratic function of the phase encode of the echo signal.

10 Claims, 12 Drawing Sheets

FIG.7A CONVENTIONAL METHOD

FIG.7B METHOD ACCORDING TO EMBODIMENT OF INVENTION

MAGNETIC RESONANCE IMAGING APPARATUS AND METHOD OF CONTROLLING THE SAME

CROSS-REFERENCE TO RELATED APPLICATION(S)

The present application claims priority from Japanese patent application JP-2020-206904 filed on Dec. 14, 2020, the content of which is hereby incorporated by reference into this application.

BACKGROUND OF THE INVENTION

1. Field of the Invention

The present invention relates to a magnetic resonance imaging apparatus (hereinafter abbreviated as an MRI apparatus), and more particularly, to a technique for acquiring an image in which artifacts caused by an FID (Free Induction Attenuation) signal are reduced.

2. Description of the Related Art

As a typical imaging method of an MRI apparatus, there is a pulse sequence of a spin echo type. In the spin echo type pulse sequence, after an RF pulse for excitation (90-degree pulse) is applied, an inversion RF pulse (180-degree pulse) is applied to diffuse the spin, and the NMR signal from the converged spin again is collected as an echo signal. In such a spin echo type pulse sequence, except the echo signal from the spin excited by the 90-degree, the signal (FID signal) from the spin excited by the 180-degree pulse is generated by the free induction decay. The spin echo signal is encoded by a phase-encoded gradient magnetic field applied after a 90-degree pulse application, but the FID signal is collected superimposed on the spin echo as a signal of zero encoding because it is an unencoded signal. Therefore, zipper-like artifacts parallel to the frequency encoding direction (artifacts caused by the FID signal: hereinafter referred to as FID artifacts) appear at the center of the image in the image reconstructed from the k-space data obtained by the spin-echo system sequence.

In imaging using a spin-echo type pulse sequence, the phase of the 180-degree pulse is usually applied inverted every repetition of the sequence to eliminate this FID artifact. This allows the FID artifact to be moved to both sides of the image, taught by, for example, Michael N. Hoff et al. "Artifacts in Magnetic Resonance Imaging", Capter 9, pp 165-190, Image Principles, Neck, and the Brain, Research Gate (2016) (Non-Patent Document 1).

SUMMARY OF THE INVENTION

The spin-echo type pulse sequence is less susceptible to static magnetic field inhomogeneity and is an excellent imaging method for acquiring T1-weighted images and T2-weighted images, but there is a problem that the conventional technique for avoiding FID artifact does not function when parallel imaging is applied to the spin-echo type pulse sequences. This is because, when parallel imaging is applied to imaging using a spin echo pulse sequence, even if the FID artifact is shifted to both sides of the image in the image before developing image folding, the FID artifact appears not at the edge of the image but at a position overlapping with the subject image in the developed image. Moreover, since the higher the acceleration rate (reduction factor), the more FID artifacts, it is difficult to shorten the measurement time by increasing the acceleration rate.

It is an object of the present invention to provide an MRI apparatus capable of acquiring an image from which artifacts are removed even when parallel imaging is applied to imaging using a spin echo type pulse sequence.

In order to solve the above problems, the MRI apparatus of the present invention controls the phase of an inversion RF pulse to be a quadratic function of the phase encode of an echo signal. This makes the absolute value of the FID signal substantially constant (e.g., zero) and zipper-like artifacts do not appear on the image.

That is, MRI apparatus of the present invention includes a static magnetic field generating magnet for generating a static magnetic field, a high-frequency transmission unit for irradiating a high-frequency magnetic field pulse to the subject placed in a static magnetic field space, a receiving unit for receiving an echo signal generated from the subject, a gradient magnetic field generating unit for generating a gradient magnetic field that encodes an echo signal, and a control unit for controlling the high-frequency transmission unit, the receiving unit and the gradient magnetic field generating unit according to a predetermined pulse sequence, and an arithmetic unit for image reconstruction using an echo signal. In performing a pulse sequence of a spin echo type using an excited RF pulse for exciting nuclear spin and an inversion RF pulse for inverting excited nuclear spin as a high-frequency magnetic field pulse, the high-frequency transmission unit changes the phase of the inversion RF pulse according to the phase encode and the phase encoding number imparted for each echo signal.

Here, the number of phase encodes is a value obtained by dividing the number of phase encodes of the original image by the reduction factor when the k-space is under-sampled in the phase encoding direction by parallel imaging. However, it is not essential to perform parallel imaging in the present invention, and the present invention can be applied even when parallel imaging is not performed.

According to the present invention, by controlling the phase of the inversion RF pulse as a function of phase encode rather than switching the phase of the inversion RF pulse to 0-π, the zipper artifact due to the FID signal can be made to be substantially zero or uniform signal value, and an image without zipper artifacts can be obtained. Unlike the conventional technique in which the FID artifact is simply moved to the edge of the image, this technique is a novel technique in which the FID artifact itself is substantially eliminated, and the problem that cannot be solved by the conventional technique can be solved by applying the technique to parallel imaging in particular.

BRIEF DESCRIPTION OF THE DRAWINGS

FIG. 7A shows an image obtained by the conventional method and FIG. 7B shows an image obtained by the method of the embodiment.

DESCRIPTION OF THE PREFERRED EMBODIMENTS

Hereinafter, an embodiment of an MRI apparatus of the present invention will be described with reference to the accompanying drawings.

Figure 1:
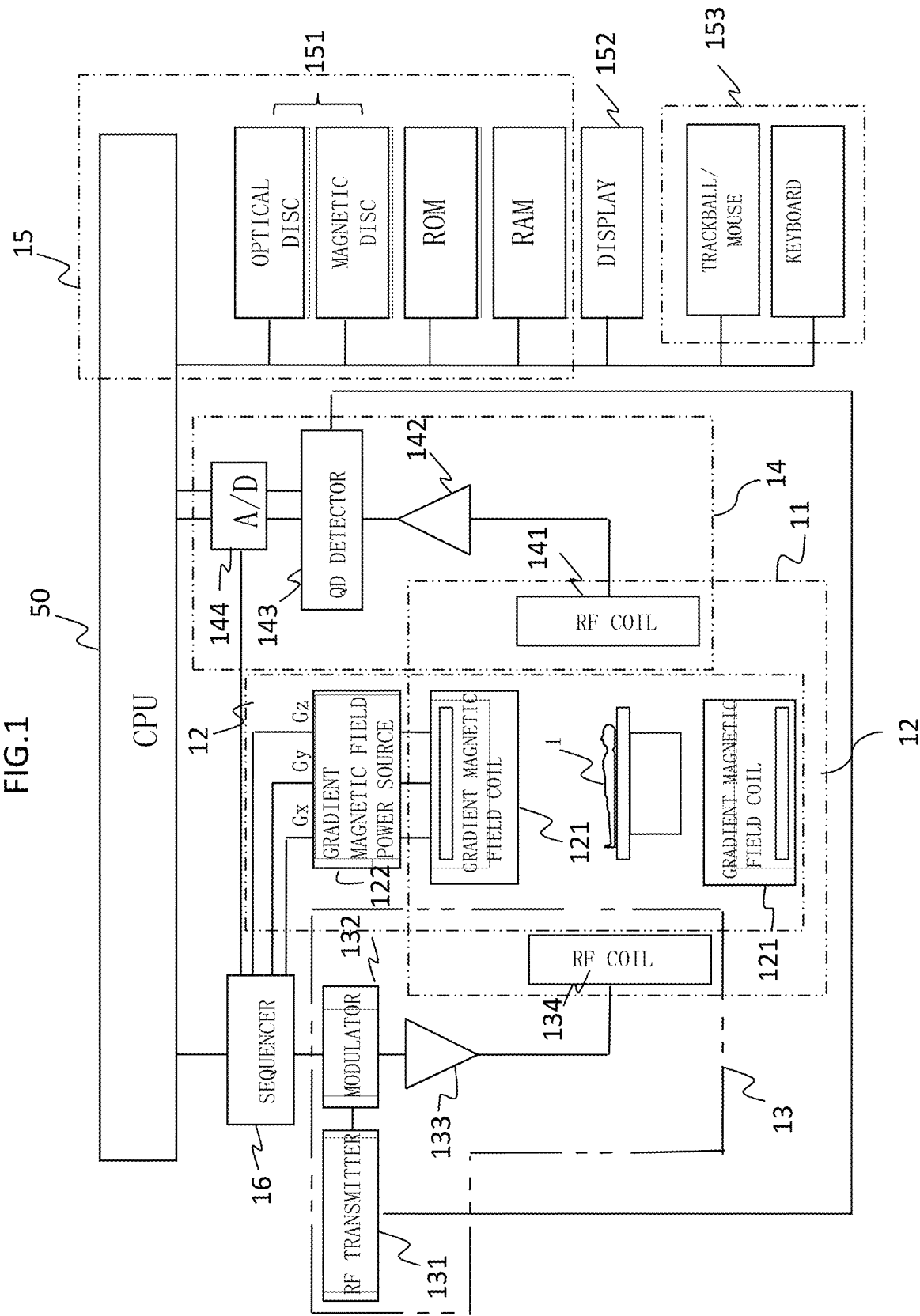
FIG. 1 is a block diagram showing an overall outline of an MRI apparatus.

MRI apparatus 100 includes, as a main configuration, an imaging part including a static magnetic field generating unit, a high-frequency transmitting unit, a receiving unit and a gradient magnetic field generating unit, a control part 30 for controlling the imaging part according to a predetermined pulse sequence, and an arithmetic part 20 for conducting image reconstruction using echo signal(s) collected by the imaging part. As shown in FIG. 1, the imaging part includes a static magnetic field generator 11, a gradient magnetic field generator 12, a transmission unit 13, a receiving unit 14, a signal processing unit 15, and a sequencer 16.

The static magnetic field generator 11 comprises a static magnetic field generating magnet which may be a permanent magnet system, or a normal or superconducting system (not shown). There is a different system such as a vertical magnetic field system and a horizontal magnetic field system depending on the direction of the static magnetic field generated by the static magnetic field generating magnet. A uniform static magnetic field is generated in the space around the subject 1, to the direction perpendicular to the body axis in the vertical magnetic field system, and to the body axis direction in the horizontal magnetic field system.

The gradient magnetic field generator 12 comprises gradient magnetic field coils 121 wound in three axial directions of a coordinate system of the MRI apparatus (stationary coordinate system) X, Y, and Z respectively, and a gradient magnetic field power source 122 for driving the respective gradient magnetic field coils. By driving the gradient magnetic field power source 122 of the respective coils according to an instruction from the sequencer 16, gradient magnetic fields Gx, Gy, Gz in three axial directions of X, Y, and Z are applied with respect to the static magnetic field.

The transmitting unit 13, in order to cause nuclear magnetic resonance to the nuclear spin of atoms constituting the biological tissue of the subject 1, irradiates a high-frequency magnetic field pulse (RF pulse) to the subject 1, and comprises a high-frequency oscillator 131, a modulator 132, a high-frequency amplifier 133 and a high-frequency coil for transmission (transmission coil) 134. The RF pulse output from the high-frequency oscillator 131 is amplitude modulated by the modulator 132 at a timing according to a command from the sequencer 16, and the amplitude modulated high-frequency pulse is amplified in the high-frequency amplifier 133 and supplied to the transmission coil 134 disposed close to the subject 1 to irradiate RF pulses to the subject 1.

The intensity and phase of the RF pulse are controlled by the modulator 132 so as to output 90-degree pulses or 180-degree pulses having different intensities, and to control their phase. In the present embodiment, the spin echo type pulse sequence, which will be described later, is executed, where the phases of the excitation pulse applied (90-degree pulse) and the inversion pulse (180 degrees) are controlled. Details of the control will be described later.

The receiving unit 14 detects the echo signal (NMR signal) emitted by the nuclear magnetic resonance of the nuclear spin constituting the biological tissue of the subject 1, and comprises a high-frequency coil for receiving (receiving coil) 141, a signal amplifier 142, a quadrature phase detector 143, and an A/D converter 144. A responsive NMR signal from the subject 1 induced by the electromagnetic wave irradiated from the transmission coil 134 is detected by the receiving coil 141 disposed close to the subject 1, amplified by the signal amplifier 142, and divided into two perpendicular systems of signals by quadrature phase detector 143 at a timing according to a command from the sequencer 16. The signals are converted into a digital amount by the A/D converter 144, and sent to the signal processing unit 15. When a coil combining a plurality of sub-coils is used as the receiving coil 141, each of the sub-coils is connected to the signal amplifier 142, the quadrature phase detector 143, and the A/D converter 144, and the signal processing unit 15 collects the signal for each sub-coil.

The signal processing unit 15 includes an external storage device 151 such as an optical disk or a magnetic disk, a display 152, and an operation unit 153 including an input device (acceptance unit) such as a track ball, a mouse, or a keyboard. The signal processing unit 15 executes processing and image reconstruction or the like, and displays a tomographic image of the subject 1 as a result on the display 152, and records them to the magnetic disk or the like of the external storage device 151. The operation unit 153 is disposed close to the display 152, and controls various processes of the MRI apparatus interactively through the operation unit 153 while the operator looks at the display 152.

In the example shown in FIG. 1, the MRI apparatus further includes a computer 50 having a CPU and a memory, and the computer 50 realizes a part of the functions of the signal processing unit 15 and the functions of the arithmetic part 20 and the control part 30. Note that a part or all of the functions of the arithmetic part 20 are included in the signal processing unit 15, and are executed when the CPU reads a predetermined program stored in the storage device. Some of the functions performed by the computer 50 may be implemented in hardware such as ASIC or FPGA.

The Sequencer 16 is a control means for repeatedly applying the RF pulse and the gradient magnetic field pulse described above in a predetermined pulse sequence, and operates, under the control of the control part 30, to send various instructions necessary for data collection of the tomographic image of the subject 1 to the transmission unit 13, the gradient magnetic field generator 12, and the receiving unit 14.

The pulse sequence includes various pulse sequences depending on the imaging method, which are stored in the storage device in advance, and the imaging sequence is determined by the user selecting the desired pulse sequence through the operation unit 153 and setting imaging parameters such as the echo time (TE), the repetition time (TR), the imaging field of view (FOV), and the acceleration rate (reduction factor) during parallel imaging. In the present embodiment, the sequencer 16 executes a pulse sequence of the spin echo type.

Figure 2:
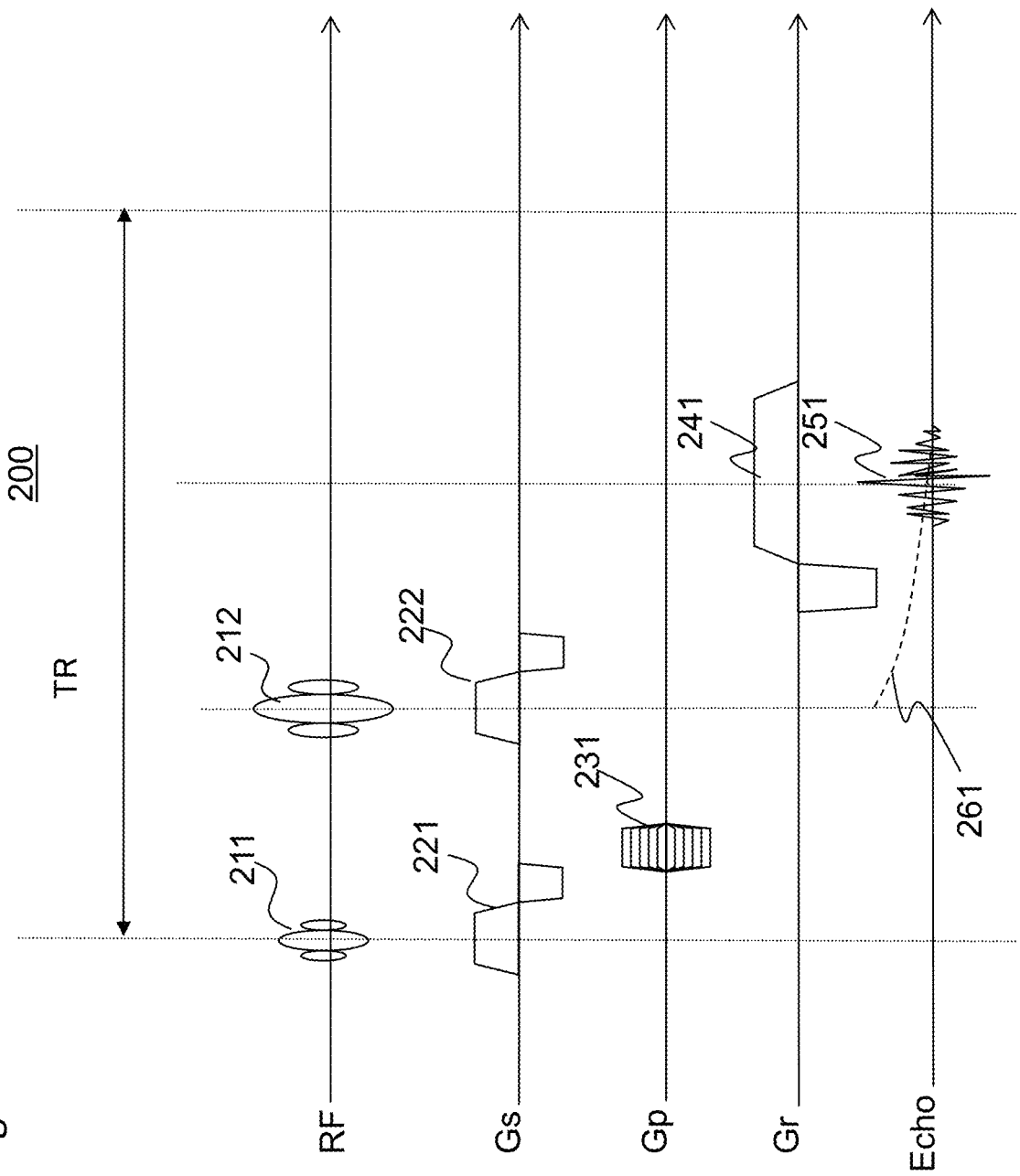
FIG. 2 shows a typical spin echo system sequence.

FIG. 2 shows an example of a typical spin-echo type pulse sequence 200. In this pulse sequence, as shown, a 90-degree pulse 211 is applied along with a slice gradient field 221 for selecting a predetermined cross-section of the subject 1 to excite spin in a predetermined cross-section. A phase-encoded gradient field 231 is then applied and a 180-degree pulse 212 is applied with a slice-gradient field 222 at ½ (TE/2) of the echo-time. As a result, an echo signal (NMR signal) 251 having a peak in the echo time is generated. The echo signal is collected for a predetermined sampling time while applying a frequency-encoded gradient field 241. After a predetermined repetition time TR from the spin excitation described above has elapsed, the collection of echo signals is repeated while varying the intensity of the phase-encoded gradient magnetic field 231 to collect echo signals of a set number of phase encodes. In the figure, the signal 261 shown by a dotted line is an FID signal generated by the 180-degree pulse 212.

Although FIG. 2 shows a two-dimensional imaging sequence in which a phase-encoded gradient magnetic field 231 is applied in a uniaxial direction (Gp), a three-dimensional imaging sequence in which the phase-encoded gradient magnetic field is applied in a two-axial direction may be used. FIG. 2 shows a case in which one echo signal 251 is generated and collected after one excitation, but a multi-echo sequence in which a plurality of 180-degree pulses is used to generate a plurality of echo signals may be used.

The MRI apparatus of the present embodiment is characterized in that the phase of the 180 degree pulse is controlled when the above-described spin echo pulse sequence is executed. Hereinafter, an embodiment of the control according to the k-space data collection method will be described.

Embodiment 1

Figure 3:
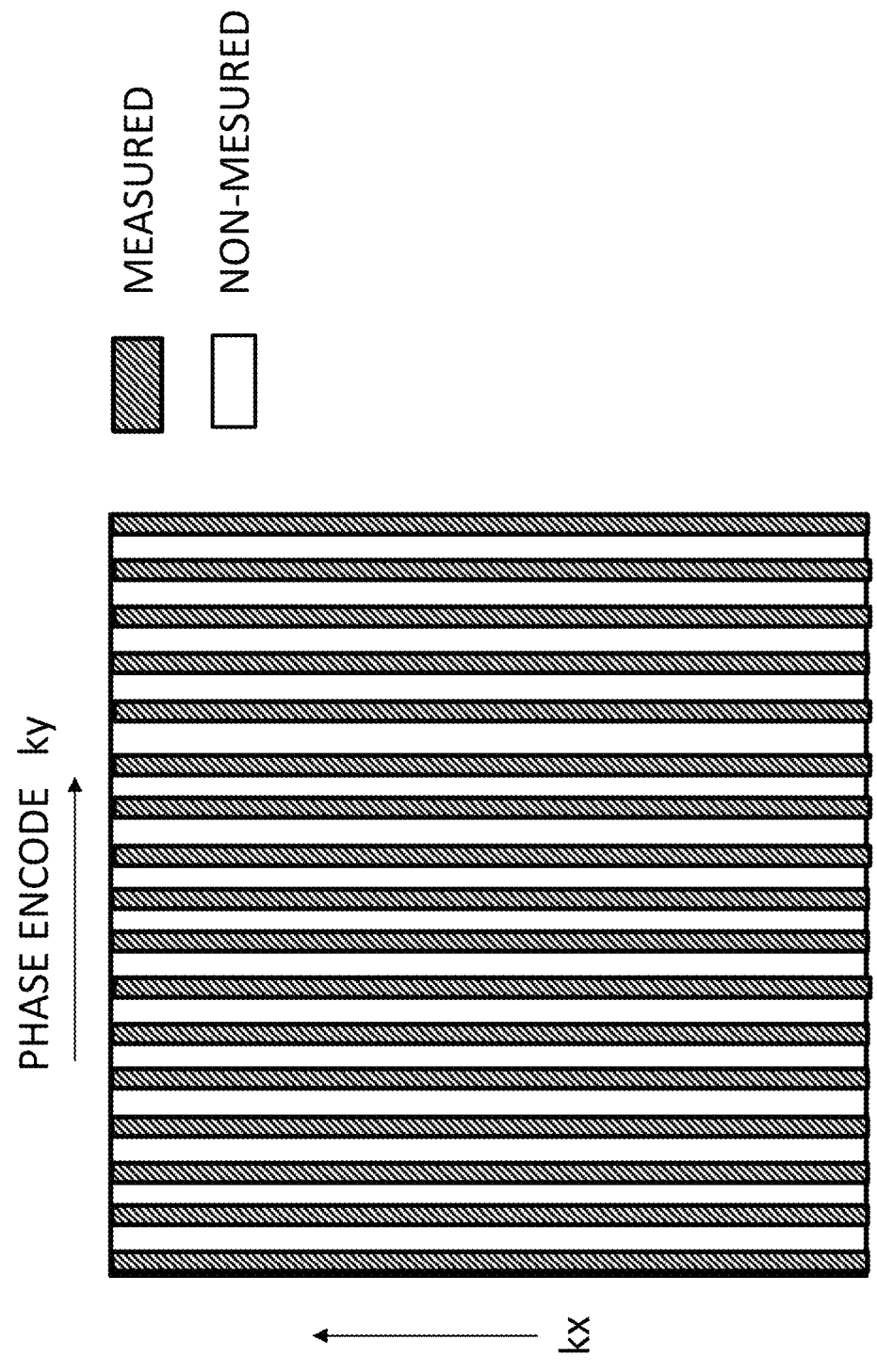
FIG. 3 is a diagram showing k-space data to be measured in the first embodiment.

In the present embodiment, in the repetition of the sequence shown in FIG. 2, the phase encoding step is decimated and changed in accordance with the set reduction factor, and parallel imaging is performed. Parallel imaging, as shown in FIG. 3, is an imaging method in which k-space data is thinned out (under-sampled) in a phase direction according to a predetermined reduction factor, and the data of the phase encoding that was not measured is inferred by an operation to acquire an image without aliasing. Although several methods (SENSE method, GRAPPA method, CAIPIRINHA method, etc.) have been established for the reconstruction method of parallel imaging for reconstructing an image without aliasing, these methods cannot separate only the FID signal, which is not phase-encoded, from the original image signal. Therefore, artifacts caused by the FID signal occur, but the conventional phase control of the inversion pulse (0-π control) cannot control the appearance position of the artifacts in the parallel imaging image.

The MRI apparatus of the present embodiment eliminates the FID artifact by changing the irradiation phase of the inversion RF pulse in the range of 0 to 360 degrees according to a quadratic function of the phase encoding with the number of substantial phase encodes as a coefficient.

Specifically, the irradiation phase θ of the inversion RF pulse, for each echo signal to be measured, and controlled by the equation (1).

[Equation 1]

$$\theta(k) = \frac{\pi(2l+1)}{N}k^2 \quad (1)$$

In the equation, k is the phase encode given to the echo signal, and N is the substantial phase encoding number represented by N=#ph/R, where #ph is the phase encoding number of the image and R is the reduction factor. Also, the coefficient (2l+1) (l is an integer of 0 or more) is a number for giving generality to the Equation so long as the numerator on the right side of Equation (1) is an odd multiple of π (the definition of the sign in the equation is the same hereinafter).

Figure 4:
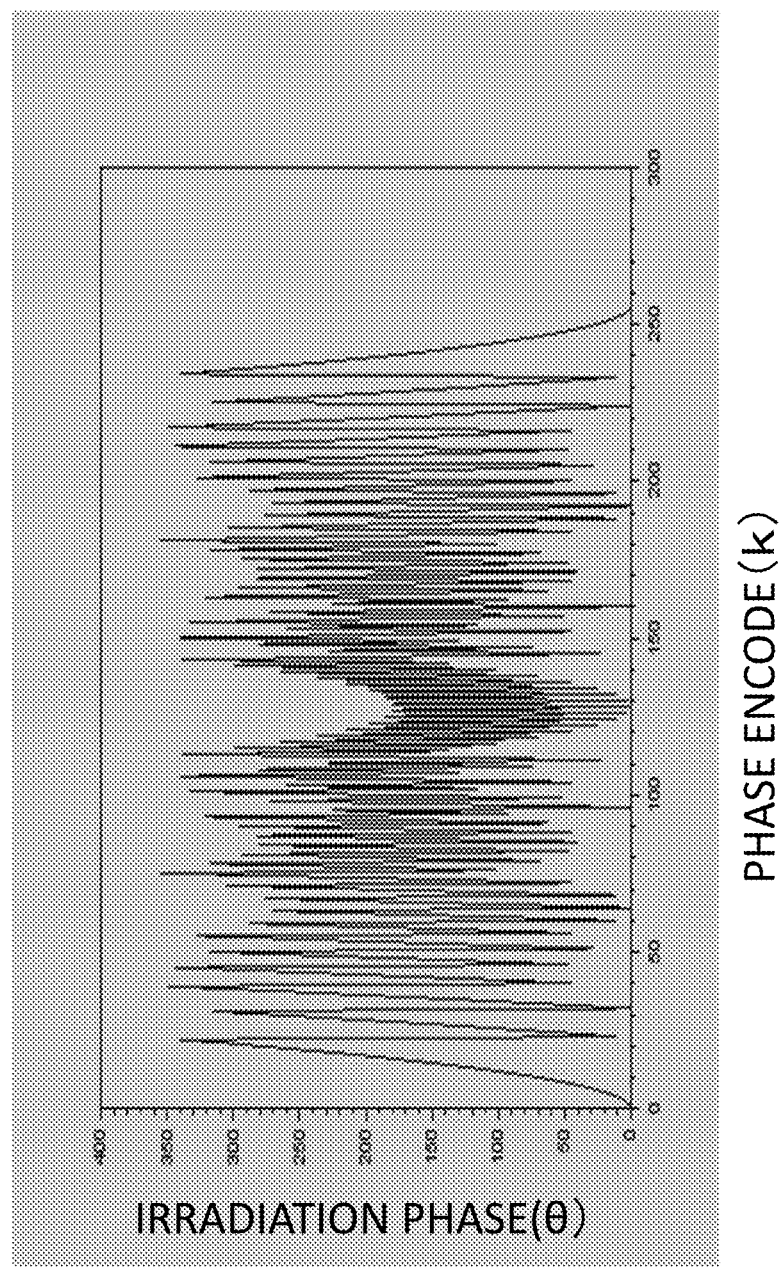
FIG. 4 shows an example of the irradiation phase of the first embodiment.

FIG. 4 shows the phase represented by Equation (1). In the figure, the horizontal axis is the phase encoding, and the vertical axis is the irradiation phase of the 180-degree pulse. In the conventional method, the phase θ between adjacent phase encodings is either 0 or π, but in the phase control of the present embodiment, the phase is a quadratic function of the phase encoding. Accordingly, it is folded by the coefficient (2l+1), and when made to be continuous without folding, it becomes a graph of the quadratic function.

Next, it will be explained that the FID artifact disappears by the above-mentioned phase control.

The FID signal obtained by RF irradiation in the phase represented by the equation (1) is represented by the equation (2).

[Equation 2]

$$S(k) = \exp(i\theta(k)) = \exp\left(\frac{i\pi}{N}k^2\right) \quad (2)$$

The FID signal is transformed to image space data by Fourier transforming of Equation (2), and can be expressed by Equation (3).

[Equation 3]

$$I(x) = \frac{1}{N}\sum_{k=0}^{N-1} S(k)\exp\left(\frac{2\pi ikx}{N}\right) \quad (3)$$

Here, the absolute value of the image of the FID signal becomes Equation (4).

[Equation 4]

$$|I(x)|^2 = \frac{1}{N}\sum_{k=0}^{N-1}\exp\left(\frac{i\pi(k+x)^2}{N}\right)\sum_{k=0}^{N-1}\exp\left(\frac{-i\pi(k+x)^2}{N}\right) \quad (4)$$

Figure 5:
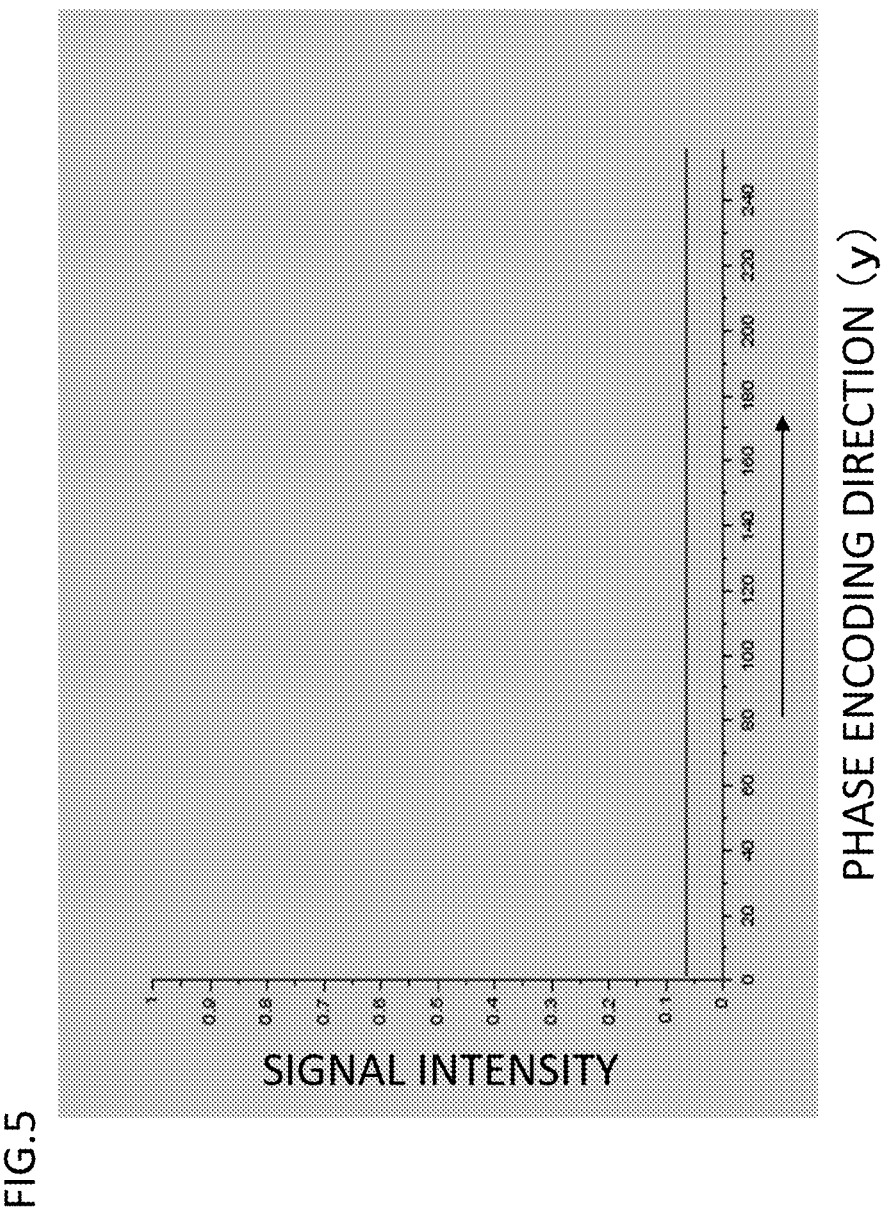
FIG. 5 shows the signal intensity of the image of the FID signal with the irradiation phase of FIG. 4.

FIG. 5 shows the plot of Equation (4) with respect to the pixel position. In FIG. 5, the horizontal axis is the position of the phase encoding direction (y), and the vertical axis is the signal intensity. As can be seen from FIG. 5, the absolute value of the signal intensity becomes constant regardless of the position of the phase encoding direction, and the FID signal is uniformly distributed. Therefore, the FID signal does not appear at a specific location on the image as an artifact.

Figure 6:
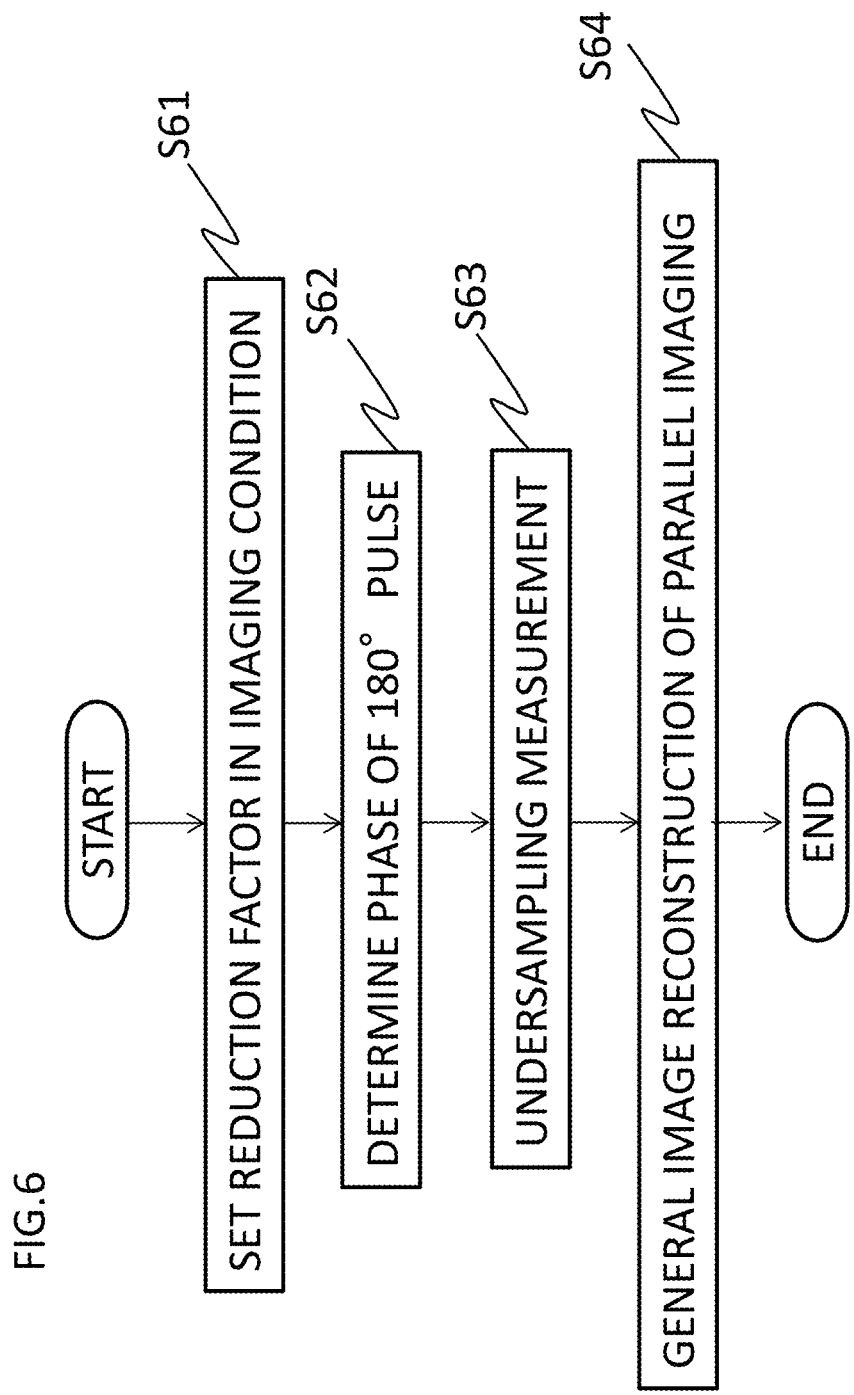
FIG. 6 is a diagram showing a flow of imaging according to Embodiment 1.

FIG. 6 shows an imaging flow of the MRI apparatus of the present embodiment. As shown, imaging conditions including a reduction factor is first set through a user-setting or inspection protocol or the like (S61). The control unit 30 determines the irradiation phase of the 180-degree pulse by Equation (1) using the set reduction factor and the measurement Matrix size (phase encoding number), and sets it to the transmission unit 13 (S62). The sequencer 16 calculates the spin echo type pulse sequence using the set imaging conditions and starts imaging. During imaging, the transmission unit 13 controls the 180-degree pulse at the set irradiation phase (S63).

After imaging is performed while controlling the irradiation phase of the inversion RF pulse as mentioned, the arithmetic unit 20 performs image reconstruction using the collected echo signals according to the calculation method of parallel imaging (S64). The image reconstruction method is the same as that of a normal MRI apparatus, and thereby, an image of good image quality in which the FID signal does not appear as an artifact can be obtained.

According to the present embodiment, artifacts caused by the FID signal can be substantially eliminated in imaging using a spin echo type sequence. Thus, it is possible to set a high reduction factor in the parallel imaging so that the speed of imaging is increased.

Figure 7:
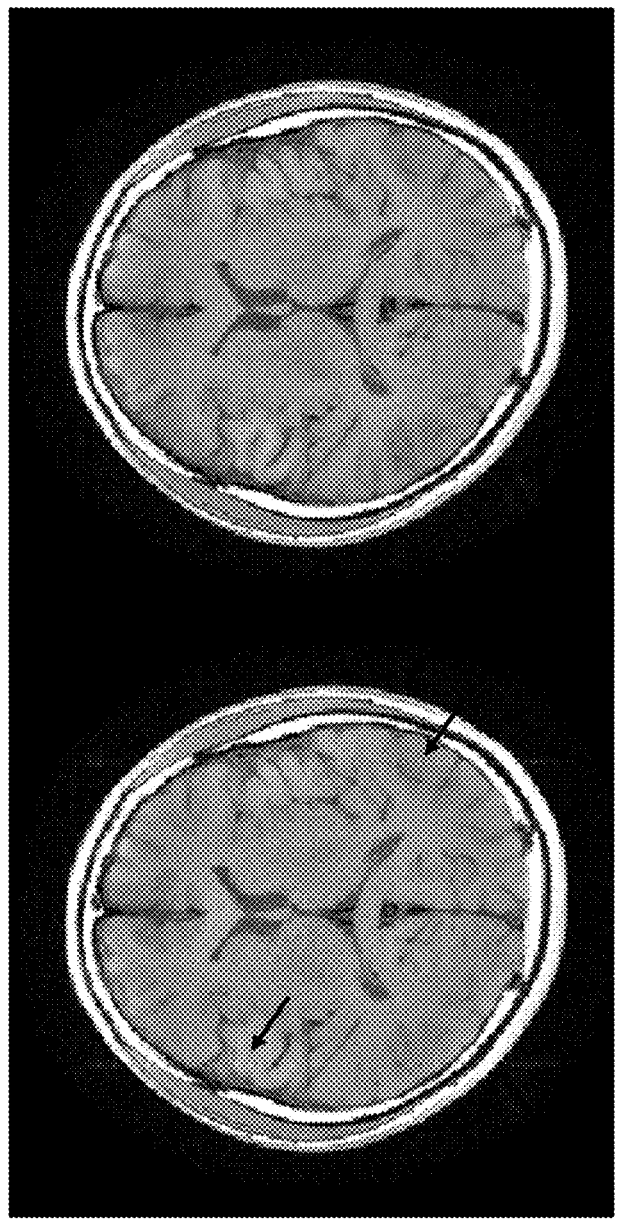
FIGS. 7 A and 7B are diagrams illustrating the effect of the embodiment, where

FIGS. 7A and 7B shows the result of comparing an image acquired by the conventional phase control of the inversion RF pulse and an image acquired by the MRI apparatus of the present embodiment. FIG. 7A shows a result of the conventional phase control and FIG. 7B shows a result of a control according to the present embodiment. In both, the reduction factor R was set to 2. Although FID signal is imaged as an artifact at a position indicated by an arrow in the image of the conventional method, in the image captured by the present embodiment it has become impossible to confirm the artifact of FID signal.

Although an embodiment in which the parallel imaging was performed has been explained, the present embodiment can also be applied to a case of measuring without under-sampling the k-space (R in Equation (1) is 1) and has a similar effect of making FID signal artifacts invisible.

Embodiment 2

Figure 8:
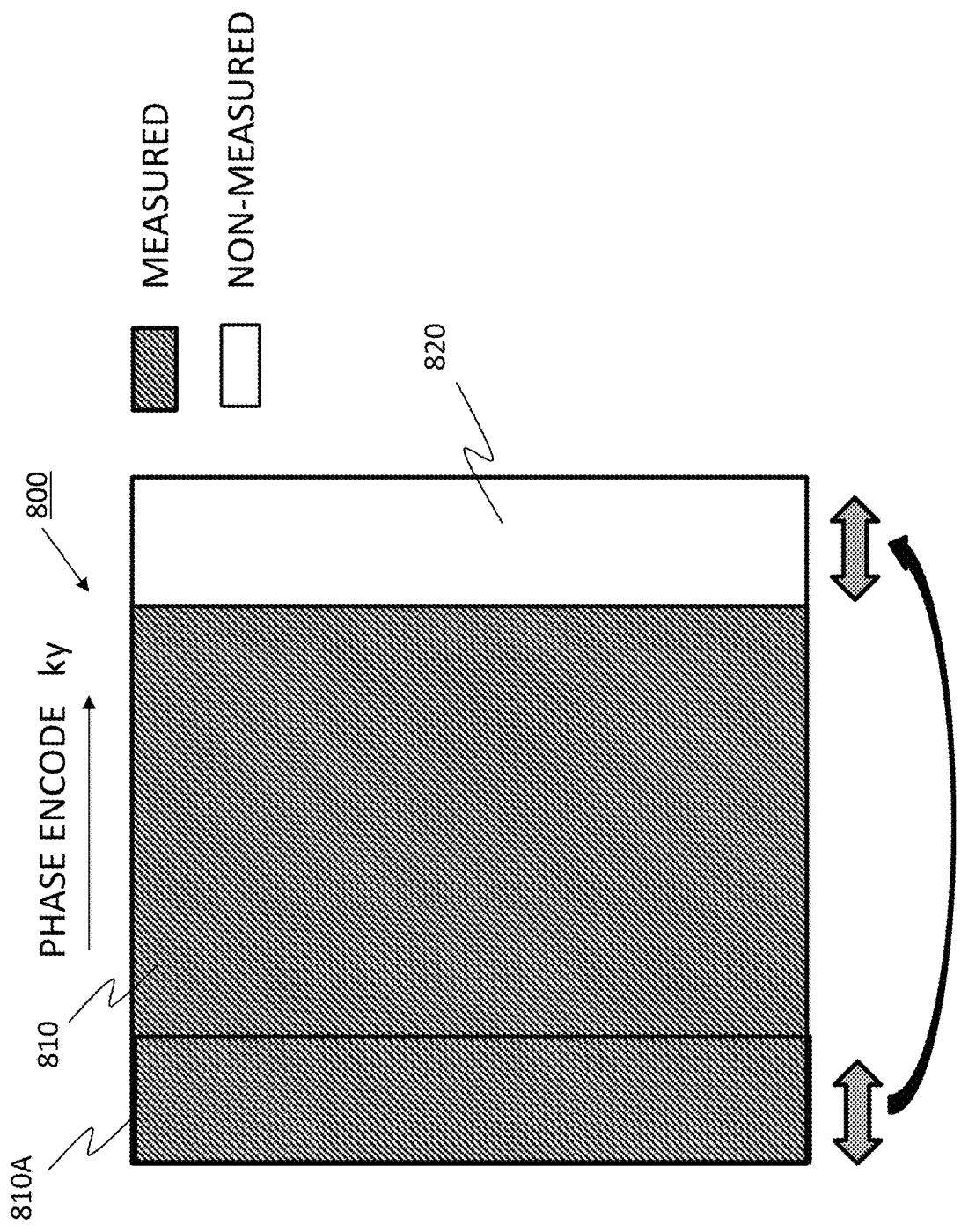
FIG. 8 is a diagram showing k-space data to be measured in Embodiment 2.

In the present embodiment, phase control of the inversion RF pulse is performed when an asymmetric measurement method, i.e., an imaging method that does not measure a portion of the k-space, is performed. Although the pulse sequence is a spin-echo type pulse sequence is the same as that of the first embodiment, in the present embodiment, as shown in FIG. 8, a portion 820 of the high-frequency region in the phase encoding direction of the k-space data 800 is not measured to increase the measurement speed. The measurement region 810 may be under-sampled (thinned out) at a predetermined reduction factor, although this is not essential.

Also in this embodiment, the flow of operation is the same as that in FIG. 6, where imaging by controlling the irradiation phase of the inversion RF pulse is performed. Equation (1) is used for the phase control, but N in Equation (1) is the phase encoding number #ph of the image including the unmeasured region 810. When parallel imaging is performed, N=#ph/R is obtained in the same manner as in the first embodiment.

The arithmetic part 20 performs image reconstruction using the echo signals collected with the thus controlled phase of the inversion RF pulse, but prior to this, performs processing for creation of a pseudo FID signal of the unmeasured region. That is, in the asymmetrical measurement method, the unmeasured region 820 is zero-filled, for example, and subjected to the image reconstruction. In this case, however, the FID signal that should occur if it has been measured is not reflected in the reconstructed image, and therefore the influence of the FID signal will be different in the measurement region 810 and the unmeasured region 820.

Figure 9:
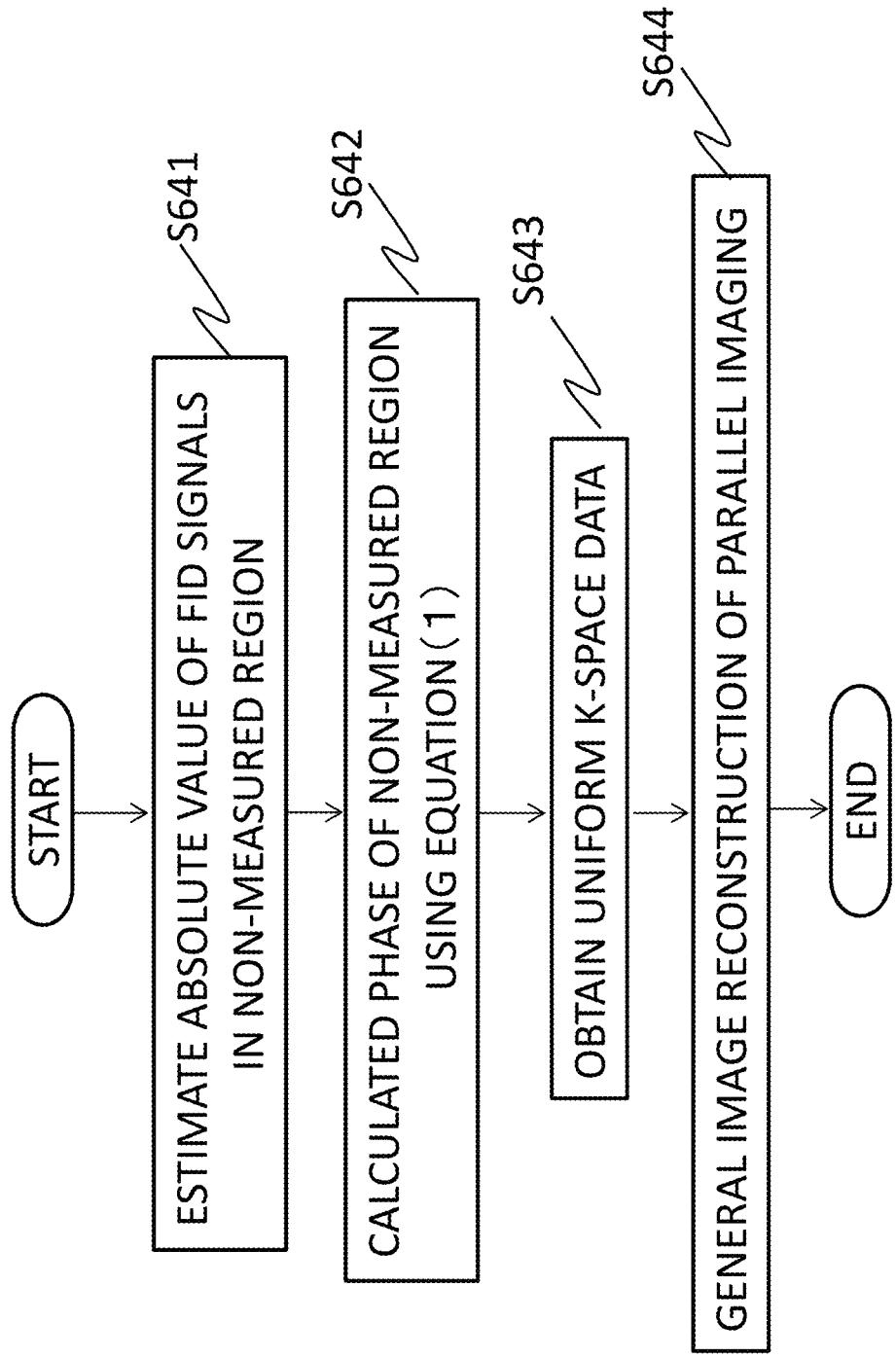
FIG. 9 is a diagram showing the image reconstruction step of Embodiment 2.

Therefore, the arithmetic part 20, first, uses the data of the region 810A to be symmetrical to the unmeasured region 820 with respect to the k-y axis (line of phase encoding 0) of the k-space, to estimate the FID signal in this region. FIG. 9 shows details of the image reconstruction step S64 in the present embodiment. In this embodiment, as shown in FIG. 9, an absolute value is calculated from the complex signal of the region 810A (S641), and a phase of the phase encode corresponding to the region 820 is calculated by the equation (1) (S642). Using the calculated absolute value and the phase of the region 820, a pseudo complex signal of the FID signal of the region 820 is created. In the case of parallel imaging, the signals of the region 820 are generated at the same under-sampling rate (reduction factor) as the region 810. As the result, k-space data in which the entire k-space is uniformly filled is obtained (S643).

The arithmetic part 20 performs normal image reconstruction or image reconstruction including parallel imaging operation using the k-space data (S644). In the thus obtained image, the echo signal is reconstructed as it is, and the FID signal component without phase encode is uniform throughout the phase encoding direction as shown in FIG. 5, so that it does not appear as an artifact on the image.

In the present embodiment, similarly to the first embodiment, when parallel imaging is applied, the reduction factor can be increased, and in combination with asymmetric measurement, further speedup can be realized.

Embodiment 3

Although the first and second embodiments perform irradiation phase control in which the FID signal is made uniform throughout the phase encoding direction, in the present embodiment, irradiation phase control is performed in which the FID artifact is limited to only a predetermined area of the image.

As explained using equations (1) to (4), in the first embodiment, the irradiation phase θ is calculated by multiplying by $k^2/N$ with respect to π as a reference, in order to make the FID signal uniform. In the present embodiment, φ(≠π) is used as a reference phase. That is, the irradiation phase is calculated using the following equation (5)

[Equation 5]

$$\theta(k) = \frac{\varphi(2l+1)}{N}k^2 \quad (5)$$

Figure 10:
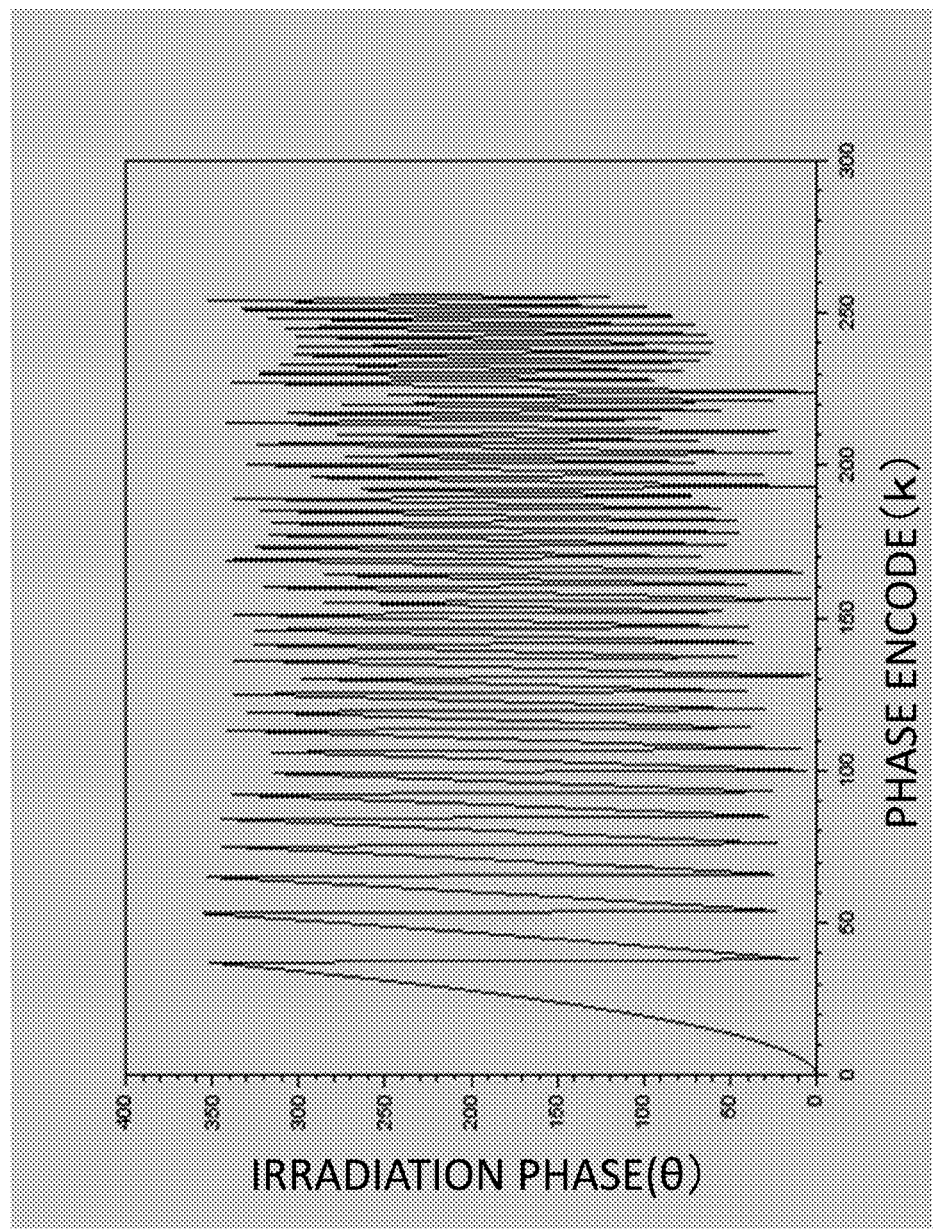
FIG. 10 shows an example of the irradiation phase of Embodiment 3.

In Equation 5, φ is φ>π or φ<π. The phase represented by Equation (5) in case of φ=64π/18 is shown in FIG. 10. As can be seen from the comparison with FIG. 4, when π is used as the reference phase, the phase changes symmetrically with respect to the center of the phase encoding direction, whereas when φ is not π, the phase changes asymmetrically with respect to the k-space.

Figure 11:
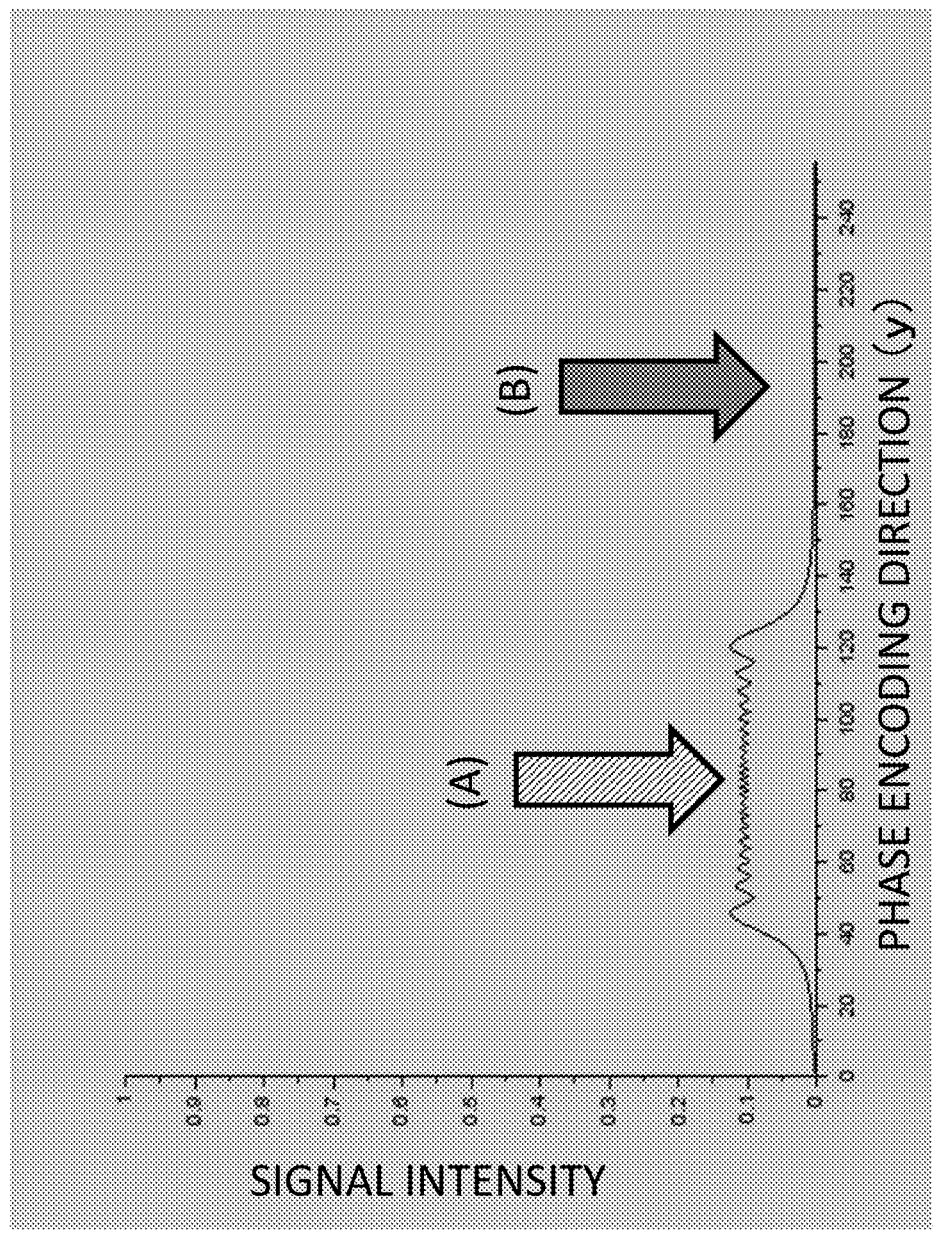
FIG. 11 is a diagram showing the signal intensity of the image of the FID signal with the irradiation phase of FIG. 10.

As shown in FIG. 11, absolute value in the image space of the FID signal of such a phase becomes large in the area of the arrow (A), but becomes substantially zero in the area of the arrow (B). Therefore, it is possible to obtain a good image without artifacts for the region of interest by making the region (region of interest) necessary for diagnosis become the region where the signal intensity of the image of the FID signal becomes zero.

Figure 12:
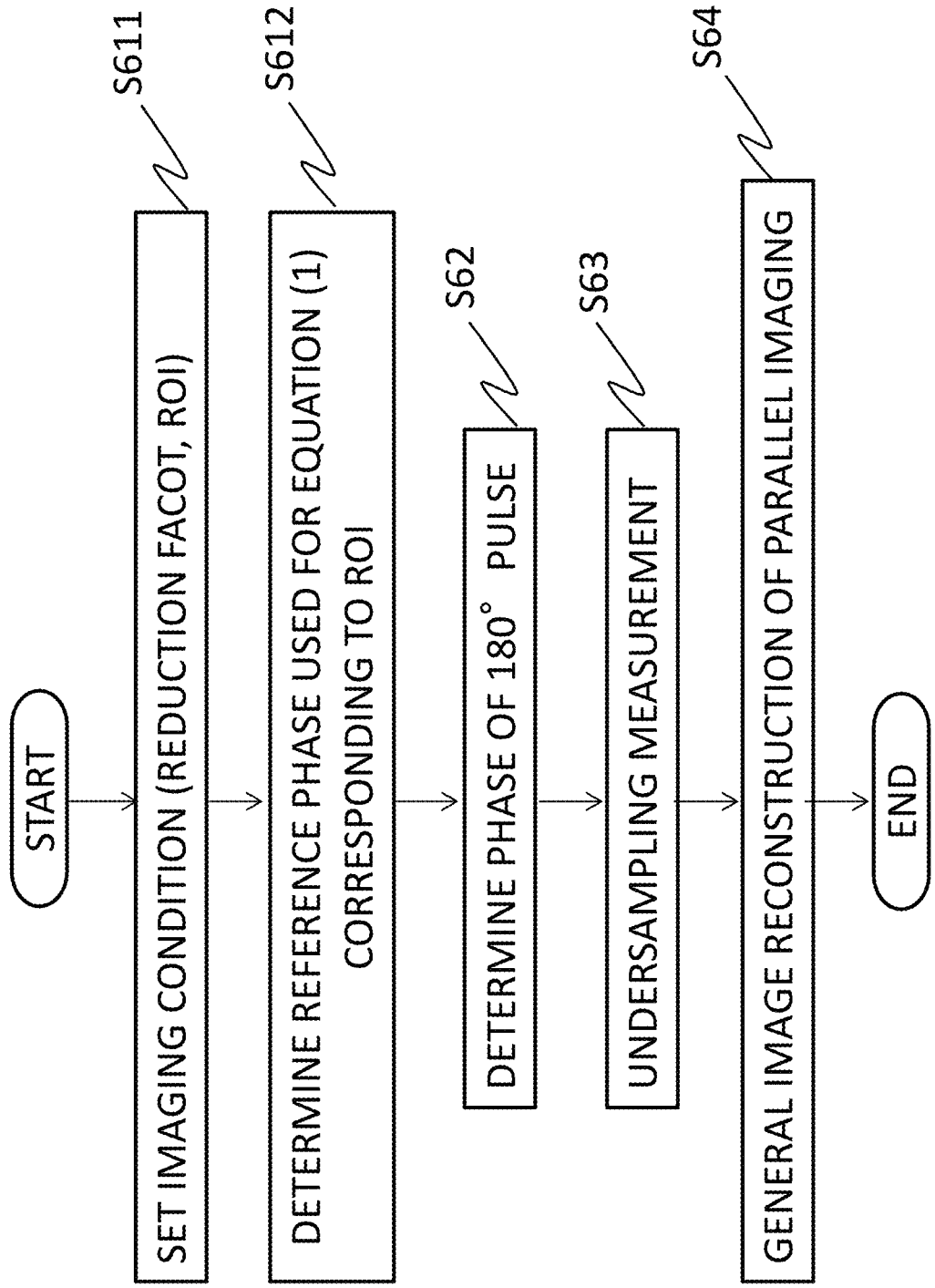
FIG. 12 showing the flow of imaging of Embodiment 3.

An example of the operation of the present embodiment is shown in FIG. 12. In FIG. 12, the same steps as those in FIG. 6 are denoted by the same reference numerals, and a repetitive description thereof is omitted.

The control part 30 receives designation of a desired area of interest as an imaging condition in addition to the reduction factor and the imaging parameter or the like (S611). Then, the control part determines φ which does not impart the FID artifact to the area (S612), and determines the irradiation phase of the 180-degree pulse using Equation (5) (S62). Since the region where the signal intensity of the FID signal in the image space is zero (FID zero region) is predictable from the amount of deviation of φ from π, φ is determined such that the region of interest is included in the predicted region. Alternatively, for a plurality of φ(s), the FID zero region as shown in FIG. 11 is determined in advance and may be registered with φ. Among the pre-registered φ(s), φ which makes the region set as the region of interest the FID zero region (an absolute value zero region) may be selected.

When there is no FID zero region including the set region of interest, Equation (1) may be used instead of Equation (5).

Thereafter, imaging is performed, and image reconstruction including normal image reconstruction or parallel imaging operation is performed in the same manner as in the first embodiment (S63, S64).

According to the present embodiment, the FID signal can be made substantially zero for the region of interest. It is to be noted that the present embodiment can be implemented in combination with the second embodiment described above.

What is claimed is:

1. A magnetic resonance imaging apparatus comprising:
a static magnetic field generating magnet for generating a static magnetic field;
a high-frequency transmitting unit for irradiating an RF pulse to a subject placed in a static magnetic field space;
a receiving unit for receiving an echo signal generated from the subject;
a gradient magnetic field generating unit for generating a gradient magnetic field for encoding the echo signal;
a control unit for controlling the high-frequency transmitting unit, the receiving unit and the gradient magnetic field generating unit according to a predetermined pulse sequence;
and an arithmetic unit for image reconstruction using the echo signal,
wherein in irradiating while using a pulse sequence of a spin echo system including irradiation of an excited RF pulse for exciting nuclear spin and irradiation of inversion RF pulses for inverting the excited nuclear spin as the pulse sequence, the high-frequency transmission unit changes an irradiation phase of each inversion RF pulse of the pulse sequence of the spin echo system that is to be irradiated after a predetermined repetition time TR from spin excitation, according to phase encode imparted for the echo signal and a phase encoding number, the irradiation phase of said each inversion RF pulse to be irradiated after the predetermined repetition time TR from the spin excitation being represented by a quadratic function of the phase encode.

2. The magnetic resonance imaging apparatus of claim 1, wherein the irradiation phase θ of said each inversion RF pulse is expressed by equation (1),

[Equation 1]

$$\theta(k) = \frac{\pi(2l+1)}{N}k^2 \quad (1)$$

where l is an integer of 0 or more, k is the phase encode and N is the phase encoding number or a substantial phase encoding number obtained by dividing the phase encoding number by a reduction factor.

3. The magnetic resonance imaging apparatus of claim 2, wherein
the control unit performs control for under-sampling k-space data at a predetermined reduction factor R in a phase encoding direction,
the high-frequency transmission unit, as N represented by the equation (1), uses the substantial phase encoding number to control the irradiation phase of said each inversion RF pulse.

4. The magnetic resonance imaging apparatus of claim 3, wherein
the control unit performs a control for not measuring a portion of a high-frequency region of the phase encoding direction of the k-space data, and
the arithmetic unit, for the unmeasured high-frequency region, uses an absolute value of a signal of a measured high-frequency region and the irradiation phase of said each inversion RF pulse calculated for the unmeasured high-frequency region to create data of the unmeasured high-frequency region.

5. The magnetic resonance imaging apparatus of claim 4, wherein
the control unit performs control for under-sampling the k-space data that is a measurement target at a predetermined reduction factor R in the phase encoding direction, and
the high-frequency transmitting unit, as N represented by the equation (1), uses the substantial phase encoding number to control the irradiation phase of said each inversion RF pulse.

6. The magnetic resonance imaging apparatus of claim 1, wherein the irradiation phase θ of said each inversion RF pulse is expressed by equation (5),

[Equation 5]

$$\theta(k) = \frac{\varphi(2l+1)}{N}k^2 \quad (5)$$

where φ≠nπ, n is an integer greater than or equal to 1, l is an integer of 0 or more, k is the phase encode and N is the phase encoding number or a substantial phase encoding number obtained by dividing the phase encoding number by a reduction factor.

7. The magnetic resonance imaging apparatus of claim 6, wherein the control unit performs control for under-sampling k-space data that is a measurement target at a predetermined reduction factor R in a phase encoding direction, and
the high-frequency transmission unit uses the substantial phase encoding number obtained by dividing a phase encoding number of an image by a reduction factor R as N represented by equation (5), to control the irradiation phase of said each inversion RF pulse.

8. The magnetic resonance imaging apparatus of claim 6, which further includes an acceptance unit for accepting designation of a region of interest, wherein the high-frequency transmission unit calculates the irradiation phase θ of said each inversion pulse which makes a pixel value generated by a FID signal substantially zero or constant in the region of interest received by the receiving unit, and controls the irradiation phase of said each inversion RF pulse to be the calculated phase.

9. A method of controlling a magnetic resonance imaging apparatus, comprising:

performing a spin echo type pulse sequence which includes irradiation of RF pulses exciting nuclear spin and irradiation of inversion RF pulses inverting excited nuclear spin; and changing an irradiation phase of each inversion RF pulse of the inversion RF pulses after a predetermined repetition time TR from spin excitation, according to a phase encode imparted for each echo signal and a phase encoding number, the irradiation phase of said each inversion RF pulse being represented by a quadratic function of the phase encode.

10. The method according to claim 9, wherein the spin echo type pulse sequence is executed at a predetermined reduction factor, and the irradiation phase of said each inversion RF pulse is made to a phase θ represented by-equation (1),

[Equation 1]

$$\theta(k) = \frac{\pi(2l+1)}{N} k^2 \qquad (1)$$

where l is an integer of 0 or more, k is the phase encode and N is a substantial phase encoding number obtained by dividing the phase encoding number by a reduction factor.

* * * * *